(12) United States Patent
Mori

(10) Patent No.: US 11,935,872 B2
(45) Date of Patent: Mar. 19, 2024

(54) SEMICONDUCTOR DEVICE AND METHOD OF MANUFACTURING SEMICONDUCTOR DEVICE

(71) Applicant: Kioxia Corporation, Tokyo (JP)

(72) Inventor: Takahiro Mori, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 191 days.

(21) Appl. No.: 17/464,140

(22) Filed: Sep. 1, 2021

(65) Prior Publication Data
US 2022/0238489 A1    Jul. 28, 2022

(30) Foreign Application Priority Data
Jan. 25, 2021 (JP) .................. 2021-009339

(51) Int. Cl.
*H01L 25/065* (2023.01)
*H01L 23/00* (2006.01)
*H01L 25/00* (2006.01)
*H01L 25/18* (2023.01)

(52) U.S. Cl.
CPC .......... *H01L 25/0657* (2013.01); *H01L 24/27* (2013.01); *H01L 24/32* (2013.01); *H01L 24/33* (2013.01); *H01L 25/18* (2013.01); *H01L 25/50* (2013.01); *H01L 24/49* (2013.01); *H01L 24/73* (2013.01); *H01L 2224/27003* (2013.01); *H01L 2224/2711* (2013.01); *H01L 2224/32145* (2013.01); *H01L 2224/32225* (2013.01); *H01L 2224/33152* (2013.01); *H01L 2224/33181* (2013.01); *H01L 2224/49175* (2013.01); *H01L 2224/73215* (2013.01); *H01L 2224/73265* (2013.01); *H01L 2225/06506* (2013.01);
(Continued)

(58) Field of Classification Search
CPC ..... H10B 80/00; H01L 25/0657; H01L 25/50; H01L 25/18; H01L 24/27; H01L 24/32; H01L 24/33; H10K 19/00; H10K 39/10; H10K 65/00; H10K 59/00; H10K 59/90; H10K 59/95; H10N 69/00; H10N 19/00; H10N 39/00; H10N 79/00; H10N 79/89
USPC ........................................................ 257/777
See application file for complete search history.

(56) References Cited

U.S. PATENT DOCUMENTS

| 6,680,524 B2 | 1/2004 | Minamio et al. |
| 2019/0287945 A1 | 9/2019 | Tojo et al. |
| 2020/0020669 A1 | 1/2020 | Uchida et al. |

(Continued)

FOREIGN PATENT DOCUMENTS

| JP | 2002-1346634 A | 5/2002 |
| JP | 2017-168586 A | 9/2017 |

(Continued)

*Primary Examiner* — Jasmine J Clark
(74) *Attorney, Agent, or Firm* — Oblon, McClelland, Maier & Neustadt, L.L.P.

(57) ABSTRACT

A semiconductor device includes: a wiring board, a chip stack provided above the wiring board and including a first semiconductor chip; a second semiconductor chip provided between the wiring board and the first semiconductor chip; a first adhesive layer provided between the first semiconductor chip and the second semiconductor chip and on the second semiconductor chip; and a sealing insulation layer including a first part and a second part, the first part covering the chip stack, and the second part extending between the wiring board and the first semiconductor chip.

13 Claims, 10 Drawing Sheets

(52) U.S. Cl.
    CPC ................ *H01L 2225/0651* (2013.01); *H01L 2225/06555* (2013.01); *H01L 2225/06586* (2013.01)

(56) References Cited

U.S. PATENT DOCUMENTS

2020/0075562 A1    3/2020    Yu et al.
2022/0005779 A1*    1/2022    Niwa .................... H01L 21/563

FOREIGN PATENT DOCUMENTS

| | | |
|---|---|---|
| JP | 2019-161007 A | 9/2019 |
| TW | 201535668 A | 9/2015 |
| TW | 201711171 A | 3/2017 |

* cited by examiner

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2021-009339, filed on Jan. 25, 2021; the entire contents of which are incorporated herein by reference.

FIELD

Embodiments disclosed herein relate to a semiconductor device.

BACKGROUND

A semiconductor device such as a NAND-type flash memory includes a plurality of semiconductor chips stacked on a wiring board. The semiconductor chips are electrically connected to the wiring board via bonding wires.

DETAILED DESCRIPTION

Figure 1:
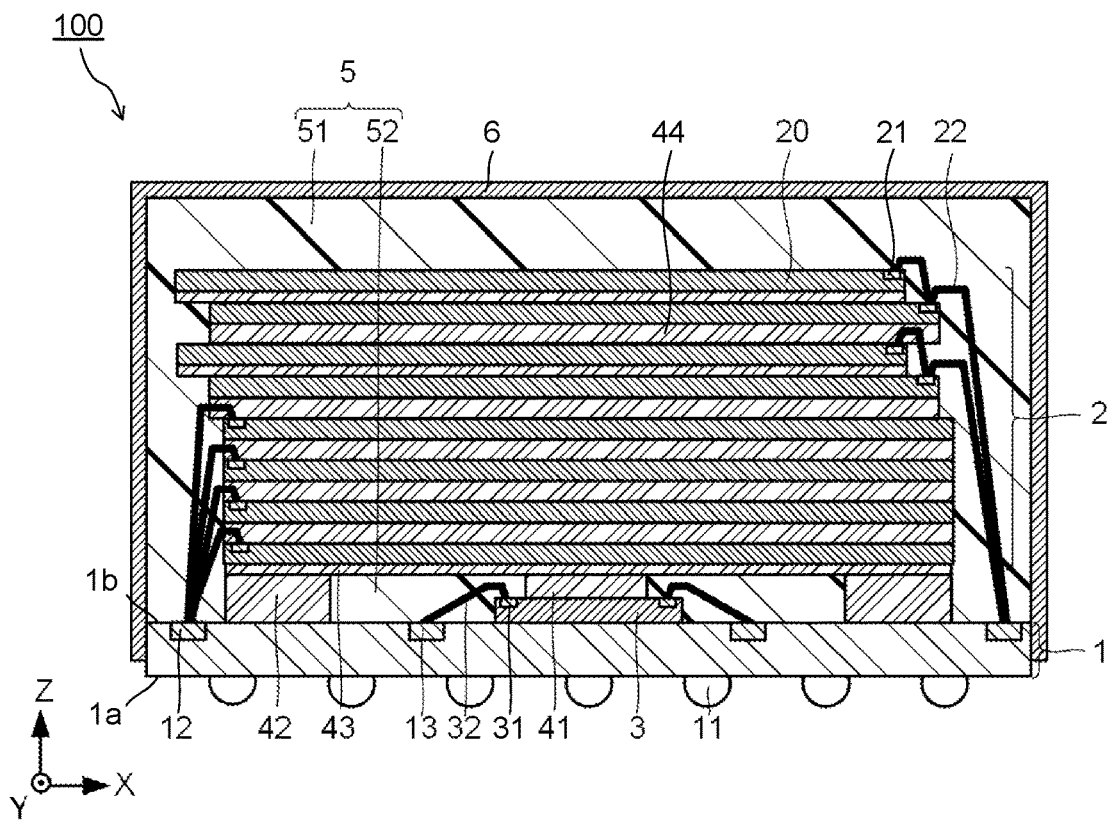
FIG. 1 is a schematic sectional view for explaining a first structure example of a semiconductor device.

A semiconductor device includes: a wiring board; a chip stack provided above the wiring board and including a first semiconductor chip; a second semiconductor chip provided between the wiring board and the first semiconductor chip; a first adhesive layer provided between the first semiconductor chip and the second semiconductor chip and on the second semiconductor chip; and a sealing insulation layer including a first part and a second part, the first part covering the chip stack, and the second part extending between the wiring board and the first semiconductor chip.

An embodiment will be hereinafter described with reference to the drawings. A relation of the thickness and planar dimension of each constituent element, thickness ratios among the constituent elements, and so on described in the drawings are sometimes different from actual ones. Further, in the embodiment, substantially the same constituent elements are denoted by the same reference signs and a description thereof is appropriately omitted.

In this specification, "connecting" includes not only physical connecting but also electrical connecting unless otherwise specified, (First Structure Example of Semiconductor Device)

FIG. 1 is a schematic sectional view for explaining a first structure example of a semiconductor device. FIG. 1 illustrates an X axis, a Y axis perpendicular to the X axis, and a Z axis perpendicular to the X axis and the Y axis. The X axis is, for example, a direction parallel to a surface 1b of a wiring board 1, the Y axis is a direction parallel to the surface 1b and perpendicular to the X axis, and the Z axis is a direction perpendicular to the surface 1b. FIG. 1 illustrates an X-Z cross section.

A semiconductor device 100 includes the wiring board 1, a chip stack 2, a semiconductor chip 3, an adhesive layer 41, an adhesive layer 42, an adhesive layer 43, an adhesive layer 44, a sealing insulation layer 5, and a conductive shield layer 6.

The wiring board 1 has a plurality of external connection terminals 11 provided on a surface 1a, and, a plurality of bonding pads 12 and a plurality of bonding pads 13 provided on the surface 1b opposite to the surface 1a. Examples of the wiring board 1 include a printed wiring board (PWB).

The external connection terminals 11 are formed using a material such as gold, copper, or solder. The external connection terminals 11 may also be formed using a lead-free solder such as tin-silver-based or tin-silver-copper-based lead-free solder. Further, the external connection terminals 11 each may also be formed using a stack of a plurality of metal material layers. The external connection terminals 11 are thrilled using conductive halls in FIG. 1, but the external connection terminals 11 may be formed using bumps.

The bonding pads 12 and the bonding pads 13 are connected to the plurality of external connection terminals 11 through internal wiring of the wiring board 1. The bonding pads 12 and the bonding pads 13 contain a metal element such as copper, silver, gold, or nickel. For example, a plating film containing the above-described material may be formed by a method such as an electrolytic plating method or an electroless plating method to thereby form the bonding pads 12 and the bonding pads 13. Further, the bonding pads 12 and the bonding pads 13 may also be formed using conductive paste.

The chip stack 2 is provided above the surface 1b of the wiring board 1. The chip stack 2 includes a plurality of semiconductor chips 20. Examples of the semiconductor chip 20 include a memory chip. The plurality of semiconductor chips 20 are stacked in order above the surface 1b of the wiring board 1. The chip stack 2 illustrated in FIG. 1 has a first stack including the four semiconductor chips 20 stacked directly on one another, a second stack including the two semiconductor chips 20 stacked in tiers on each other on the above-described first stack, and a third stack including the two semiconductor chips 20 stacked in tiers on each other on the above-described second stack. In other words, the plurality of semiconductor chips 20 stacked in tiers on each other partially overlap with each other. The number of the semiconductor chips 20 and a stacked structure of the semiconductor chips 20 are not limited to the number and a stacked structure illustrated in FIG. 1.

The plurality of semiconductor chips 20 each have a plurality of connection pads 21. The connection pads 21 are connected to the bonding pads 12 through bonding wires 22 corresponding thereto. The bonding wires 22 contain a metal element such as gold, silver, copper, or aluminum.

The semiconductor chip 3 is provided between the wiring board 1 and the lowermost semiconductor chip 20. Examples of the semiconductor chip 3 include a memory controller chip. The semiconductor chip 3 is mounted on the surface 1b of the wiring board 1, and is electrically connected to the semiconductor chips 20 through the wiring board 1. The semiconductor chip 3 may be provided on the surface 1b with an adhesive layer interposed therebetween. When the semiconductor chip 20 is the memory chip and the semiconductor chip 3 is the memory controller chip, the semiconductor chip 3 controls operations such as writing data to the semiconductor chip 20 and reading data from the semiconductor chip 20.

The adhesive layer 41 is provided between the lowermost semiconductor chip 20 and the semiconductor chip 3. The adhesive layer 41 is provided on the lop surface of the semiconductor chip 3. The adhesive layer 41 is provided to make the lowermost semiconductor chip 20 and the semiconductor chip 3 adhere to each other, for example.

The adhesive layer 42 is provided between the lowermost semiconductor chip 20 and the semiconductor chip 3 and around the adhesive liner 41 along the surface 1b. The adhesive layer 42 is spaced from the adhesive layer 41. In FIG. 1, the adhesive layers 41 and 42 are illustrated in the same cross section for convenience, but this is not restrictive.

Figure 2:
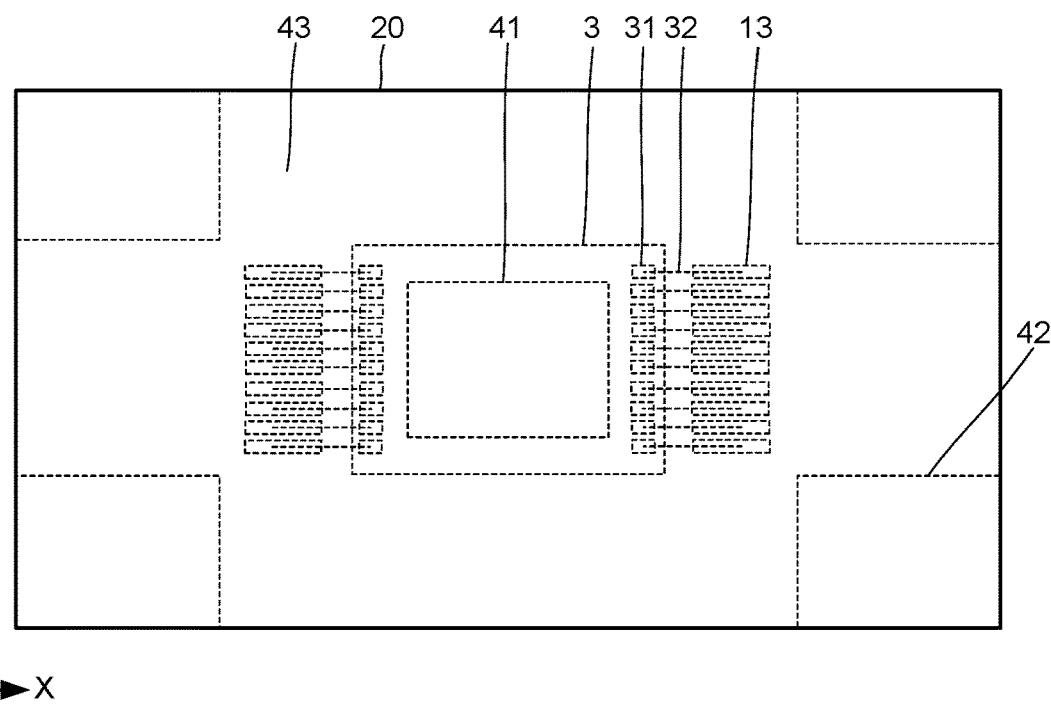
FIG. 2 is a schematic plan view including a part of the semiconductor device.

FIG. 2 is a schematic plan view including a part of the semiconductor device. 100 in the first structure example, and illustrates an X-Y plane. FIG. 2 illustrates the semiconductor chip 3, the adhesive layer 41, the adhesive layer 42, and the adhesive layer 43.

FIG. 2 illustrates that the semiconductor device 100 has the four adhesive layers 42 around the adhesive layer 41 along a surface of the semiconductor chip 20. The four adhesive layers 42 overlap with four corners of the surface of the lowermost semiconductor chip 20. As illustrated in FIG. 2, overlapping the adhesive layers 42 with end portions of the surface of the lowermost semiconductor chip 20 allows the semiconductor chip 20 to be stably supported. The number and positions of the adhesive layers 42 are not limited to the number and positions illustrated in FIG. 2.

The adhesive layer 43 is provided between the lowermost semiconductor chip 20 and the adhesive layer 41 and between the lowermost semiconductor chip 20 and the adhesive layers 42. The adhesive layer 43 illustrated in FIG. 1 is provided on a lower surface of the lowermost semiconductor chip 20, and, the adhesive layer 41 and the adhesive layers 42. The adhesive layer 43 makes the semiconductor chip 20 and the semiconductor chip 3 adhere to each other together with the adhesive layer 41 and makes the semiconductor chip 20 and the wiring board 1 adhere to each other together with the adhesive layers 42. The presence of the adhesive layer 43 enhances adhesiveness between the semiconductor chips 20 and the sealing insulation layer 5. The semiconductor device 100 may have a spacer between the lowermost semiconductor chip 20 and the adhesive layer 43, to make the lowermost semiconductor chip 20 and the adhesive layer 43 adhere to each other with the spacer interposed therebetween.

The adhesive layer 44 is provided between one of the semiconductor chips 20 and another of the semiconductor chips 20. The semiconductor device 100 illustrated in FIG. 1 includes a plurality of adhesive layers 44. The adhesive layers 44 each make one and another of the plurality of semiconductor chips 20 adhere to each other. As illustrated in FIG. 1, when one of the plurality of bonding wires 22 is partially embedded in one of the adhesive layers 44, the one of the adhesive layers 44 is preferably thicker than another of the adhesive layers 44. This prevents the contact between the bonding wire 22 and the semiconductor chip 20, for example.

Examples of the adhesive layer 41 to examples of the adhesive layer 44 include a die attach film (DAF).

The sealing insulation layer 5 seals the chip stack 2 and the semiconductor chip 3. The sealing insulation layer 5 includes a resin area 51 (a first part) covering the chip stack 2 and a resin area 52 (a second part) extending between the wiring board 1 and the lowermost semiconductor chip 20. The resin area 52 extends between the adhesive layer 41 and the adhesive layers 42 to surround the adhesive layer 41 in the X-Y plane, for example. The resin area 52 illustrated in FIG. 1 is provided on the top surface of the semiconductor chip 3.

The insulation resin layer 5 has an inorganic filler such as silicon oxide ($SiO_2$) and is formed by a molding method such as transfer molding, compression molding, or injection molding, using a sealing resin comprising in which the inorganic filler is mixed with a resin such as an organic resin, for example.

The conductive shield layer 6 covers at least a part of a side surface of the wiring board 1 and the sealing insulation layer 5, for example. The conductive shield layer 6 is preferably formed with a metal layer having low electric resistivity for preventing leakage of unnecessary electromagnetic waves emitted from the semiconductor chips 20 in the sealing insulation layer 5 and a wiring layer of the wiring board 1, the metal layer containing a material such as copper, silver, or nickel. A thickness of the conductive shield layer 6 is preferably set in accordance with its electric resistivity. The conductive shield layer 6 may be connected to a wiring line connected to an external connection terminal such as a ground terminal, by partly exposing a via in the wiring board. 1 to form a contact of the via with the conductive shield layer 6.

In the semiconductor device 100, the silicon oxide used for the sealing insulation layer 5 is different in thermal expansion coefficient from the die attach film used for the adhesive layers 41 to 44. This difference causes a difference in a shrinkage percentage between the sealing insulation layer 5 and each of the adhesive layers 41 to 44 to easily increase a warpage of the semiconductor device 100, in a sealing process of sealing the chip stack 2 and the semiconductor chip 3 to form the sealing insulation layer 5. This warpage is easily formed in the lowermost semiconductor chip 20 in particular. This is because disposing the semiconductor chip 3 between the wiring board 1 and the lowermost semiconductor chip 20 makes thicknesses of the adhesive layers 41 to 43 larger than thicknesses of the adhesive layers 44 to prevent the contact between the semiconductor chip 20 and the semiconductor chip 3.

In contrast, the semiconductor device of this embodiment includes the resin area 52 extending between the wiring board 1 and the chip stack 2 to decrease the difference in the shrinkage percentage between the sealing insulation layer 5 and each of the adhesive layers 41 to 44 and thus prevent the warpage.

Moreover, the semiconductor device of this embodiment includes the adhesive layer 41 on the top surface of the semiconductor chip 3 to prevent a detect such as displacement of the semiconductor chip 3, the displacement being caused by inflow of a sealing resin when the sealing resin flows in between the wiring board 1 and the lowermost semiconductor chip 20 to form the resin area 52 in the sealing process, for example. Consequently, the semiconductor device achieves high (First Method of Forming Adhesive Layers)

The following description with reference to FIG. 3 to FIG. 7 includes a method example of forming the adhesive layers 41 to 43 in a method of manufacturing the semiconductor device of this embodiment. FIG. 3 to FIG. 7 are schematic sectional views for explaining a first method example of forming the adhesive layers, and each illustrate the X-Z cross section.

Figure 3:
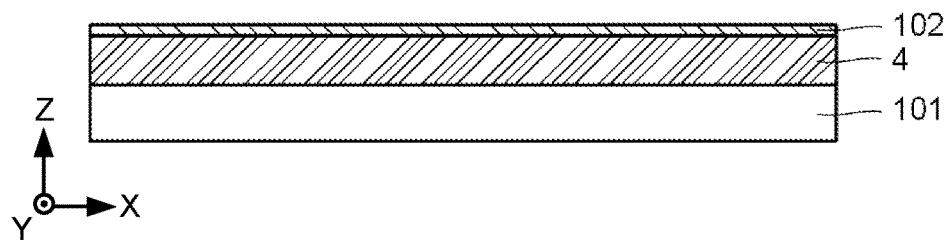
FIG. 3 is a schematic sectional view for explaining a first method example of forming adhesive layers.

First, as illustrated in FIG. 3, an adhesive film 4 is formed on a substrate 101, and a release layer 102 is formed on the adhesive film 4. The adhesive film 4 is formed by pulling out the die attach film wound around a roll onto the substrate 101 to cut it in a desired shape, for example.

The substrate 101 is preferably made of a material capable of adhering to the adhesive film 4. Examples of the substrate 101 include materials such as polyethylene terephthalate (PET), polyimide (PI), and polycarbonate (PC).

The release layer 102 is preferably made of a material capable of adhering to the adhesive film 4. Examples of the release layer 102 include materials such as PET, PI, polyethylene (PE), and polypropylene (PP).

Figure 4:
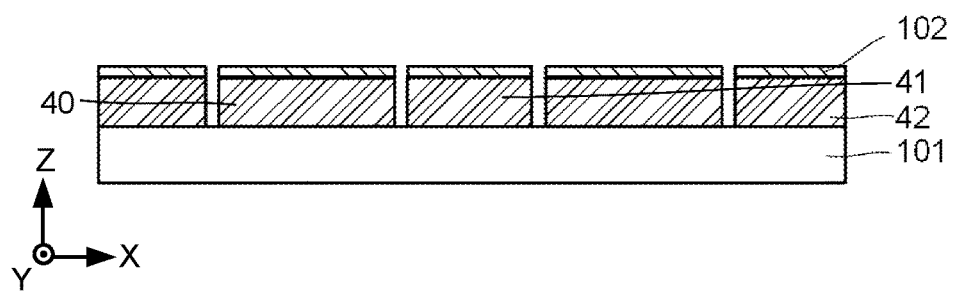
FIG. 4 is a schematic sectional view for explaining the first method example.

Next, as illustrated in FIG. 4, a stack of the adhesive film 4 and the release layer 102 is cut to thereby form adhesive layer 40, the adhesive layer 41, and the adhesive layer 42. The laminate of the adhesive film 4 and the release layer 102 can be cut by partially radiating the stack with laser beam such as, for example, YAG laser beam or ultraviolet laser beam to partially remove the stack.

Figure 5:
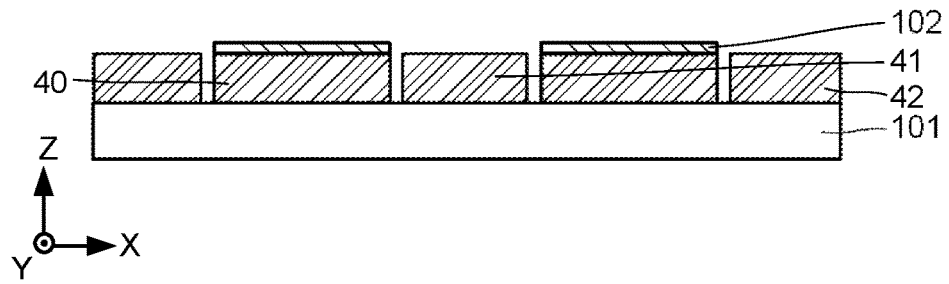
FIG. 5 is a schematic sectional view for explaining the first method example.

Next, as illustrated in FIG. 5, the release layer 102 on the adhesive layers 41 and 42 are removed with the release layer 102 on the adhesive layers 40 remaining. The release layer 102 can be removed by radiating the release layer 102 to be removed with laser beam such as yttrium vanadate ($YVO_4$) laser beam.

Figure 6:
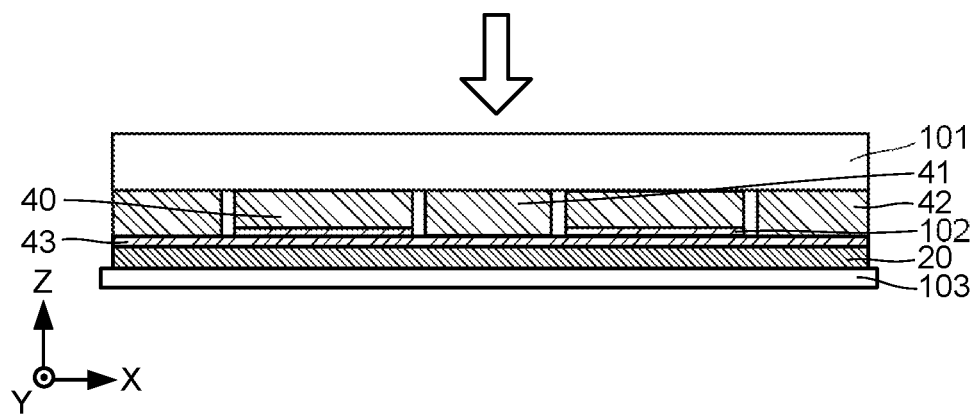
FIG. 6 is a schematic sectional view for explaining the first method example.

Next, as illustrated in FIG. 6, the adhesive layer 41, the adhesive layer 42, and the release layer 102 are pressure-bonded to the semiconductor chip 20 bonded on a dicing tape 103 with the adhesive layer 43 formed on the semiconductor chip 20 interposed therebetween. The semiconductor chip 20 is formed by dicing a semiconductor wafer. The presence of the adhesive film 4 having a size corresponding to a size of the semiconductor chip 20 enables to easily align the semiconductor chip 20 and each of the adhesive layer 41, the adhesive layer 42 and the release layer 102 with one another.

Figure 7:
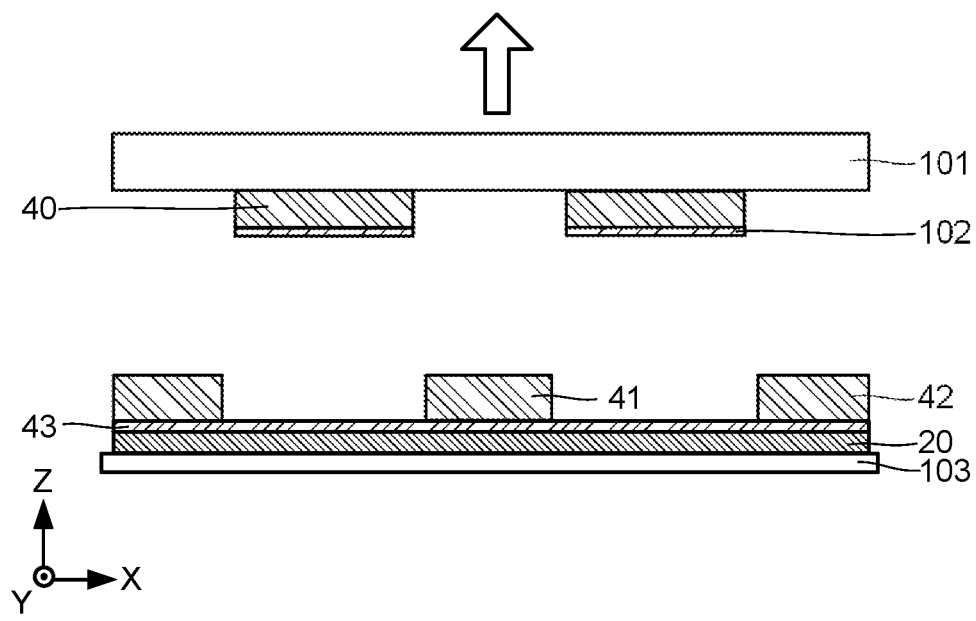
FIG. 7 is a schematic sectional view for explaining the first method example.

Next, as illustrated in FIG. 7, the substrate 101 and each of the adhesive layers 41 and 42 are separated away from each other. At this time, the release layer 102 is also separated away from the adhesive layer 43 together with the adhesive layer 40. The above process forms the adhesive layers 41 to 43 on the semiconductor chip 20. The above-described structure is also referred to as a Film On Die (FOD) structure. When the release layer 102 is separated away from the adhesive layer 43, the release layer 102 may be adjusted so that an adhesive strength of a surface side (upper side) on the adhesive layer 40 is higher than that of a surface side (lower side) on the adhesive layer 43 in order to prevent the release layer 102 from remaining on the adhesive layer 43. Examples of a method of adjusting the above-described adhesive strength include a method of making the upper surface of the release layer 102 rougher than that on the lower surface thereof, a method of forming an adhesive layer onto the upper surface of the release layer 102 to improve its adhesiveness, and a method of performing surface treatment such as a fluorine coat on the lower surface of the release layer 102 to reduce adhesiveness.

The semiconductor chip 20 having the above-described FOD structure is bonded to the wiring board 1 and the semiconductor chip 3 with the adhesive layers 41 to 43 interposed therebetween, as illustrated in FIG. 1. Thereafter, the chip stack 2 is formed by stacking the one or more semiconductor chips 20. Moreover, the sealing insulation layer 5 is formed by being filled with the sealing resin through the sealing process, and the conductive shield layer 6 is formed.

The first method example includes the release layer 102 covering the adhesive layer 40 to prevent a residual (contamination) of the adhesive layer 40 on the surface of the semiconductor chip 20 when the substrate 101 and each of the adhesive layers 41 and 42 are separated away from each other, for example.

Moreover, the first method example includes partially removing the release layer 102 using a processing means such as laser beam enables removal of the adhesive layer 40 with the adhesive layers 41 and 42 remaining to quickly form the adhesive layers 41 and 42.

(Second Method of Forming Adhesive Layers)

Another method example of forming the adhesive layers 41 to 43 in the method of manufacturing the semiconductor device of this embodiment will be described with reference to FIG. 8 to FIG. 11. FIG. 8 to FIG. 11 are schematic sectional views for explaining a second method example of forming the adhesive layers, and each illustrate the X-Z cross section. Regarding the same parts as those in the first method a description thereof can be omitted to be appropriately quoted from the description of the first method.

Figure 8:
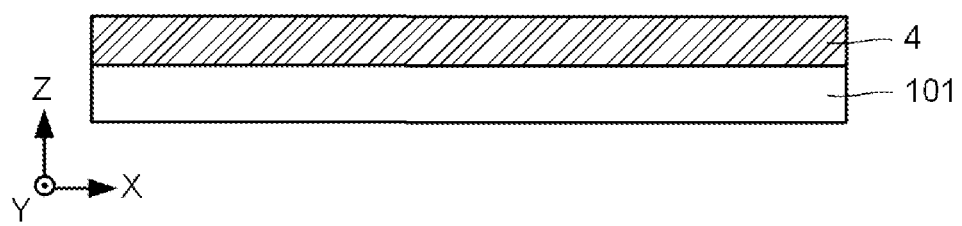
FIG. 8 is a schematic sectional view for explaining a second method example of forming the adhesive layers.

First, as illustrated in FIG. 8, the adhesive film 4 is formed on the substrate 101. The adhesive film 4 is formed the same as the first method.

Figure 9:
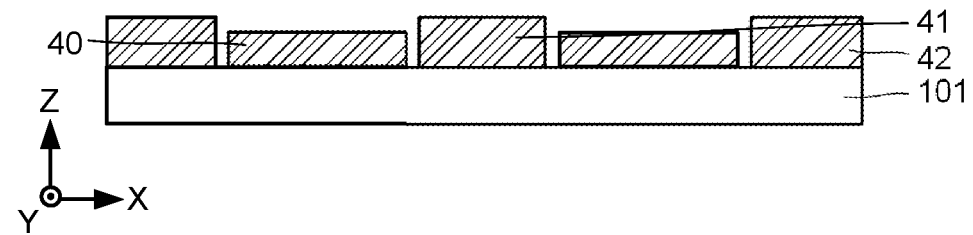
FIG. 9 is a schematic sectional view for explaining the second method example.

Next, as illustrated in FIG. 9, the adhesive film 4 is cut to thereby form the adhesive layer 40, the adhesive layer 41, and the adhesive layer 42. The adhesive film 4 can be cut by partially radiating the adhesive film 4 with laser beam such as YAG laser beam, ultraviolet laser beam, or carbon dioxide laser beam ($CO_2$ laser beam) to partially remove the adhesive film 4. The adhesive layer 40 is processed to be thinner than the adhesive layers 41 and 42 by a processing method such as the above-described radiation with the laser beam. The order of the cutting and the thinning of the adhesive film 4 is not particularly limited. The thinning can be achieved by decreasing the intensity of the laser beam more than that in the cutting.

Figure 10:
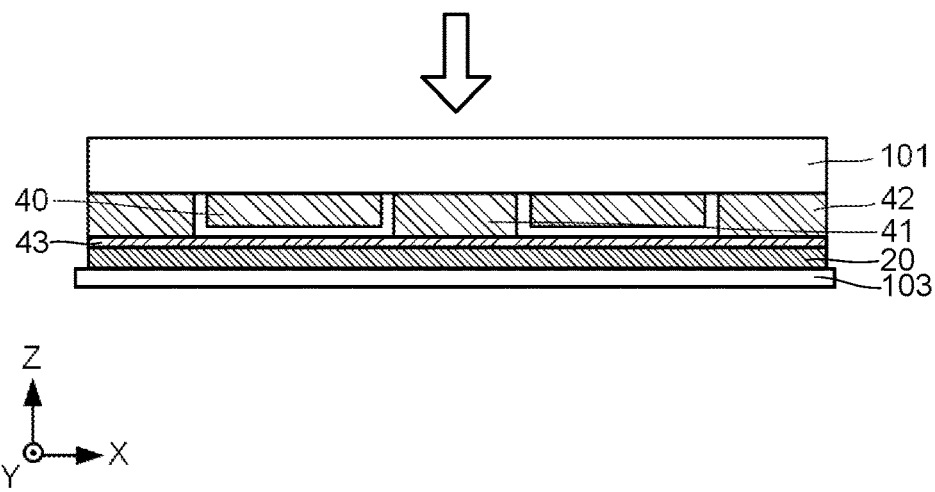
FIG. 10 is a schematic sectional view for explaining the second method example.

Next, as illustrated in FIG. 10, the adhesive layers 41 and 42 are pressure-bonded to the semiconductor chip 20 bonded on the dicing tape 103 with the adhesive layer 43 formed on the semiconductor chip 20 interposed therebetween. At this time, since the adhesive layer 40 is thinner than each of the adhesive layers 41 and 42, it is not pressure-bonded to the semiconductor chip 20. The semiconductor chip 20 is formed the same as the first method.

Figure 11:
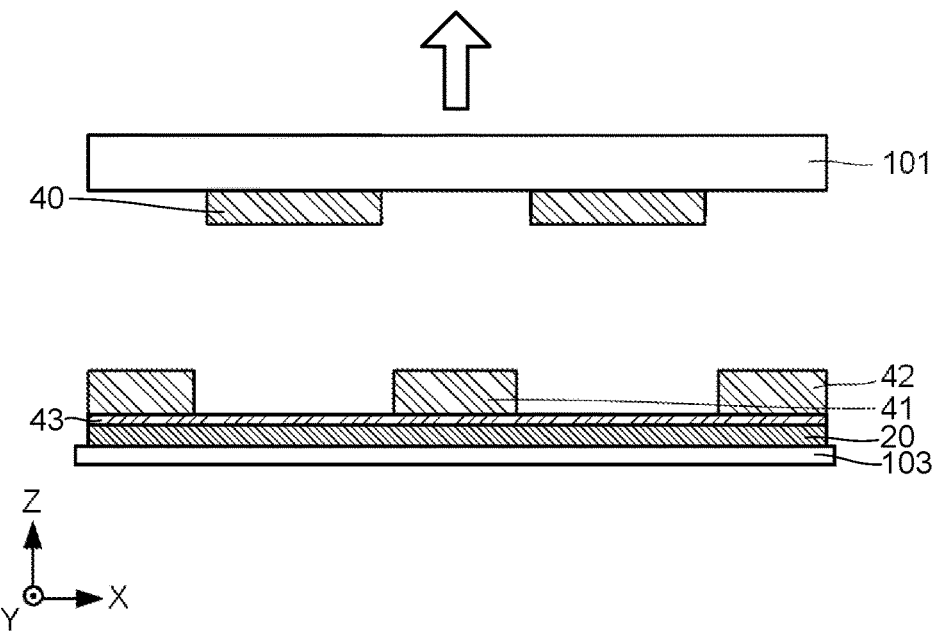
FIG. 11 is a schematic sectional view for explaining the second method example.

Next, as illustrated in FIG. 11, the substrate 101, and, the adhesive layers 41 and 42 are physically separated away from each other. At this time, the adhesive layer 40 is also separated away from the adhesive layer 43 together with the substrate 101. The above process enables to form the adhesive layers 41 to 43.

The semiconductor chip 20 having the FOD structure is bonded to the wiring board 1 and the semiconductor chip 3 with the adhesive lakes 41 to 43 interposed therebetween, as illustrated in FIG. 1. Thereafter, the chip stack 2 is formed by stacking the one or more semiconductor chips 20. Moreover, the sealing insulation layer 5 is formed by being filled with the sealing resin through the sealing process, and the conductive shield layer 6 is formed.

The second method example includes processing the adhesive layer 40 to be thinner, to enable easy bonding between the semiconductor chip 20, and the wiring board 1 and the semiconductor chip 3 even though the adhesive layers 41 and 42 are formed to be thick.

(Second Structure Example of Semiconductor Device)

Figure 12:
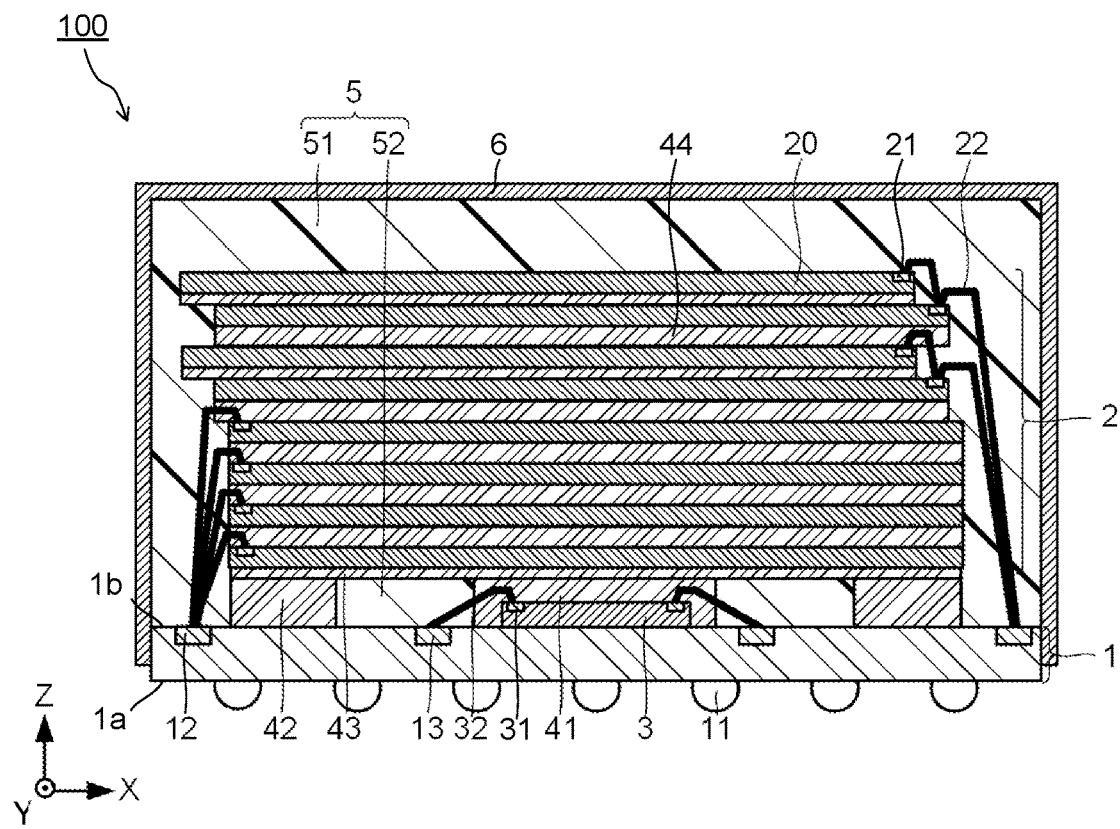
FIG. 12 is a schematic sectional view for explaining a second structure example of the semiconductor device.

FIG. 12 is a schematic sectional view for explaining a second structure example of the semiconductor device, and illustrates the X-Z cross section.

The semiconductor device 100 illustrated in FIG. 12 includes the wiring board 1, the chip stack 2, the bonding wire 22, the semiconductor chip 3, the bonding wire 32, the adhesive layer 41, the adhesive layer 42, the adhesive layer 43, the adhesive layer 44, the sealing insulation layer 5, and the conductive shield layer 6. Since the wiring board 1, the chip stack 2, the bonding wire 22, the semiconductor chip 3, the bonding wire 32, the adhesive layer 42, the adhesive layer 43, the adhesive layer 44, and the conductive shield layer 6 are the same as those in the first structure example of the semiconductor device, a description thereof can be omitted here to be appropriately quoted from the description of the first structure example.

Figure 13:
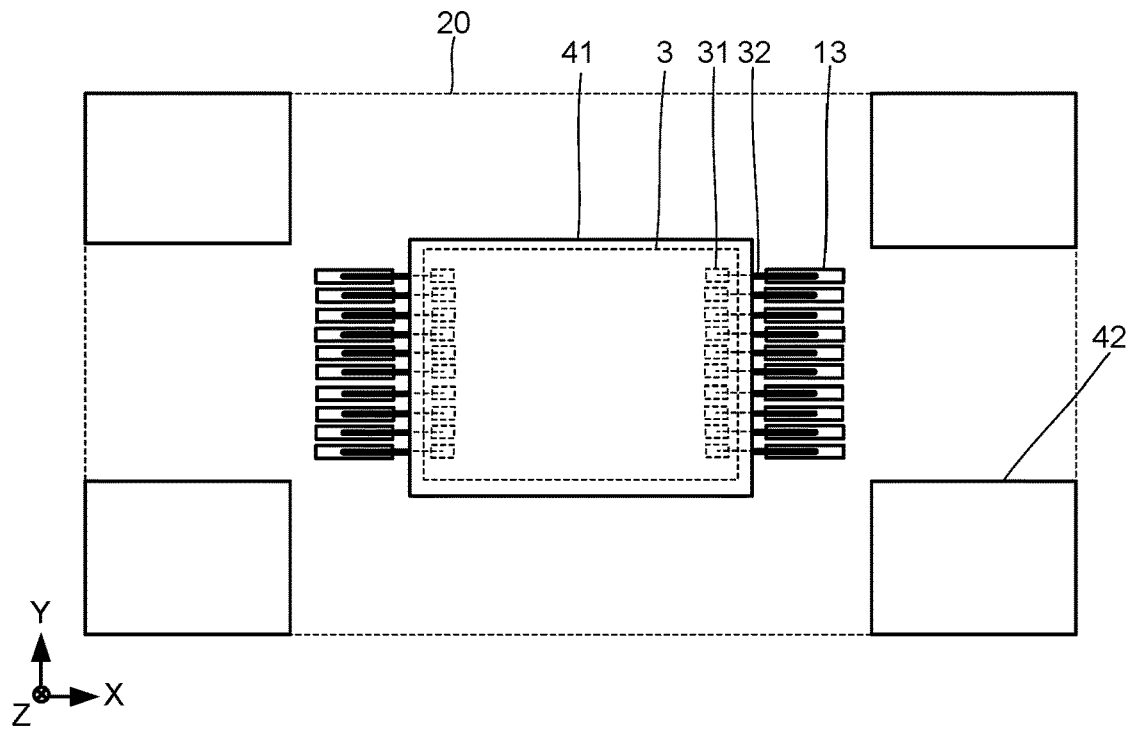
FIG. 13 is a schematic plan view including a pan of the semiconductor device.

FIG. 13 is a schematic plan view including a part of the semiconductor device 100 in the second structure example, and illustrates the X-Y plane. FIG. 13 illustrates the semiconductor chip 3, the adhesive layer 41, and the adhesive layer 42.

The adhesive layer 41 is provided between the lowermost semiconductor chip 20 and the semiconductor chip 3. The adhesive layer 41 is provided on the top surface of the semiconductor chip 3, and covers the semiconductor chip 3. The adhesive layer 41 covering the semiconductor chip 3 prevents formation of a gap such as a void in the resin area 52 and to prevent deformation such as bending or tilting of the bonding wire 32 due to the inflow of the sealing resin when the sealing resin flows in between the wiring board 1 and the lowermost semiconductor chip 20 to form the resin area 52 in the sealing process, for example. Consequently, the semiconductor device achieves high reliability.

The second structure example of the semiconductor device can be appropriately combined with another structure example of the semiconductor device.

(Third Structure Example of Semiconductor Device)

Figure 14:
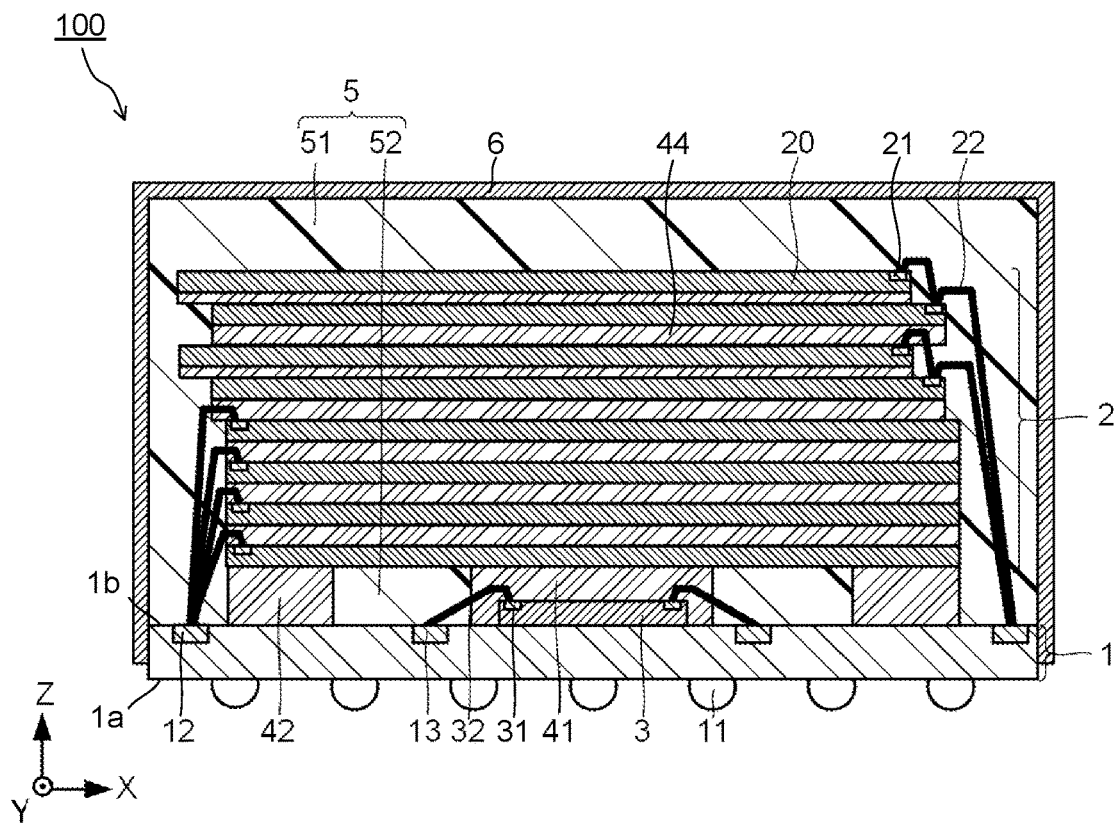
FIG. 14 is a schematic sectional view for explaining a third structure example of the semiconductor device.

FIG. 14 is a schematic sectional view for explaining a third structure example of the semiconductor device, and illustrates the cross section.

The semiconductor device 100 illustrated in FIG. 14 includes the wiring board 1, the chip stack 2, the bonding wire 22, the semiconductor chip 3, the bonding wire 32, the adhesive layer 41, the adhesive layer 42, the adhesive layer 44, the sealing insulation layer 5, and the conductive shield layer 6. Since the wiring board 1, the chip stack 2, the bonding wire 22, the semiconductor chip 3, the bonding wire 32, the adhesive layer 41, the adhesive layer 42, the adhesive layer 44, and the conductive shield layer 6 are the same as those in the second structure example of the semiconductor device, a description thereof can be omitted here to be appropriately quoted from the description of the first structure example.

Figure 15:
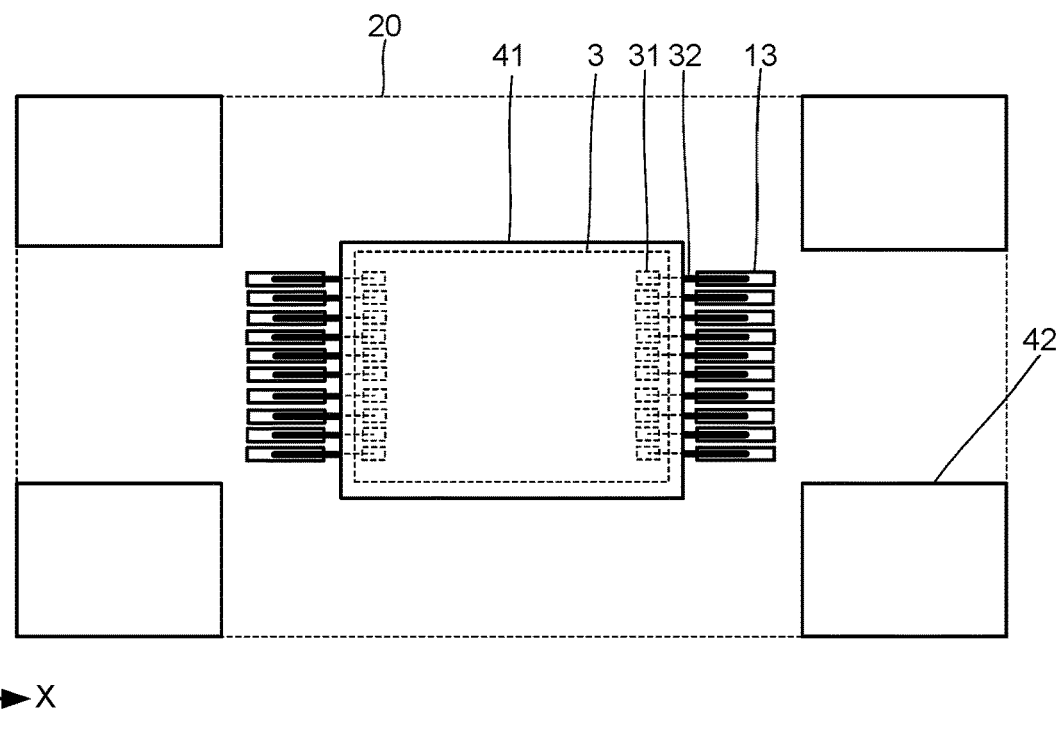
FIG. 15 is a schematic plan view including a part of the semiconductor device.

FIG. 15 is a schematic plan view including a part of the semiconductor device 100 in the third structure example, and illustrates the X-Y plane. FIG. 15 illustrates the semiconductor chip 3, the adhesive layer 41, and the adhesive layer 42.

The third structure example of the semiconductor device does not have the adhesive layer 43. For example, when no problem arises even though the bonding wire 32 adheres to the lowermost semiconductor chip 20, the adhesive layer 43 can be omitted. The omission of the adhesive layer 43 enables the semiconductor device to have high reliability and to save costs for manufacturing the semiconductor device, for example.

The third structure example of the semiconductor device can be appropriately combined with another structure example of the semiconductor device.

(Fourth Structure Example of Semiconductor Device)

Figure 16:
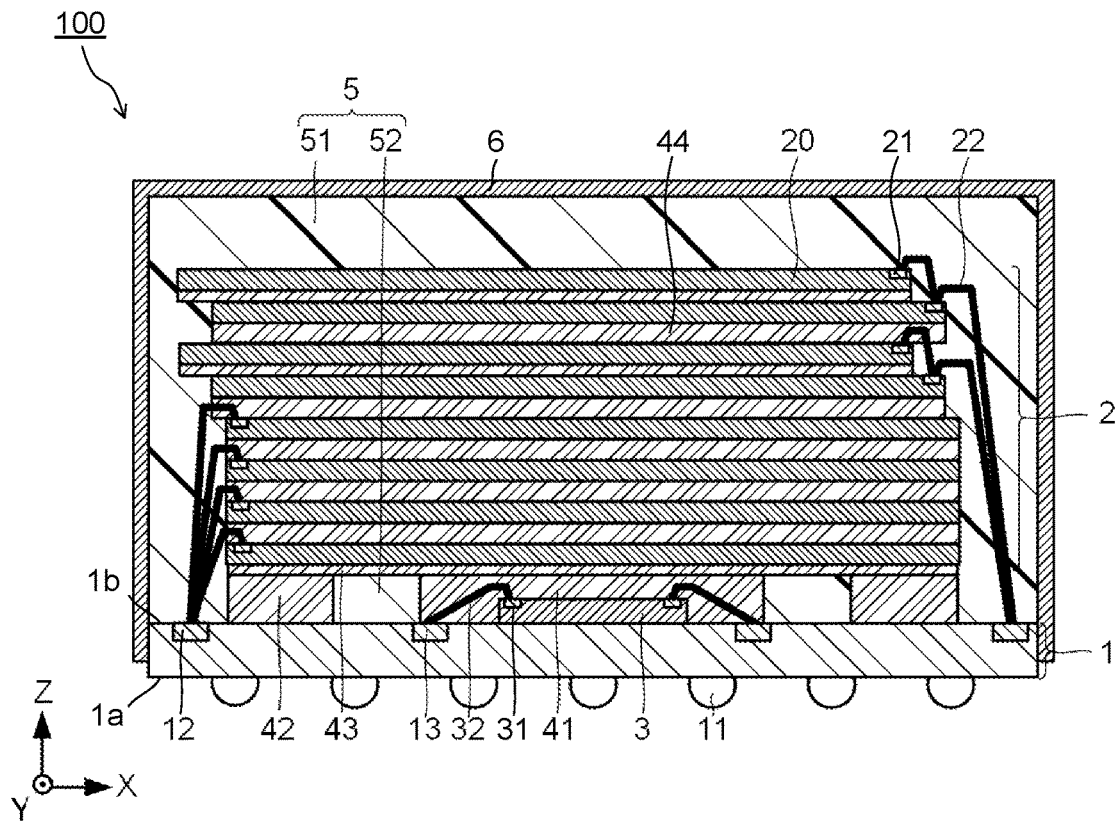
FIG. 16 is a schematic sectional view for explaining a fourth structure example of the semiconductor device.

FIG. 16 is a schematic sectional view for explaining a fourth structure example of the semiconductor device, and illustrates the X-Z cross section.

The semiconductor device 100 illustrated in FIG. 16 includes the wiring board 1, the chip stack 2, the bonding wire 22, the semiconductor chip 3, the bonding wire 32, the adhesive layer 41, the adhesive layer 42, the adhesive layer 43, an adhesive layer 44, the sealing insulation layer 5, and the conductive shield layer 6. Since the wiring board 1, the chip stack 2, the bonding wire 22 the semiconductor chip 3, the bonding wire 32, the adhesive layer 42, the adhesive layer 43, the adhesive layer 44, and the conductive shield layer 6 are the same as those in the first structure example of the semiconductor device, a description thereof can be omitted here to be appropriately quoted from the description of the first structure example.

Figure 17:
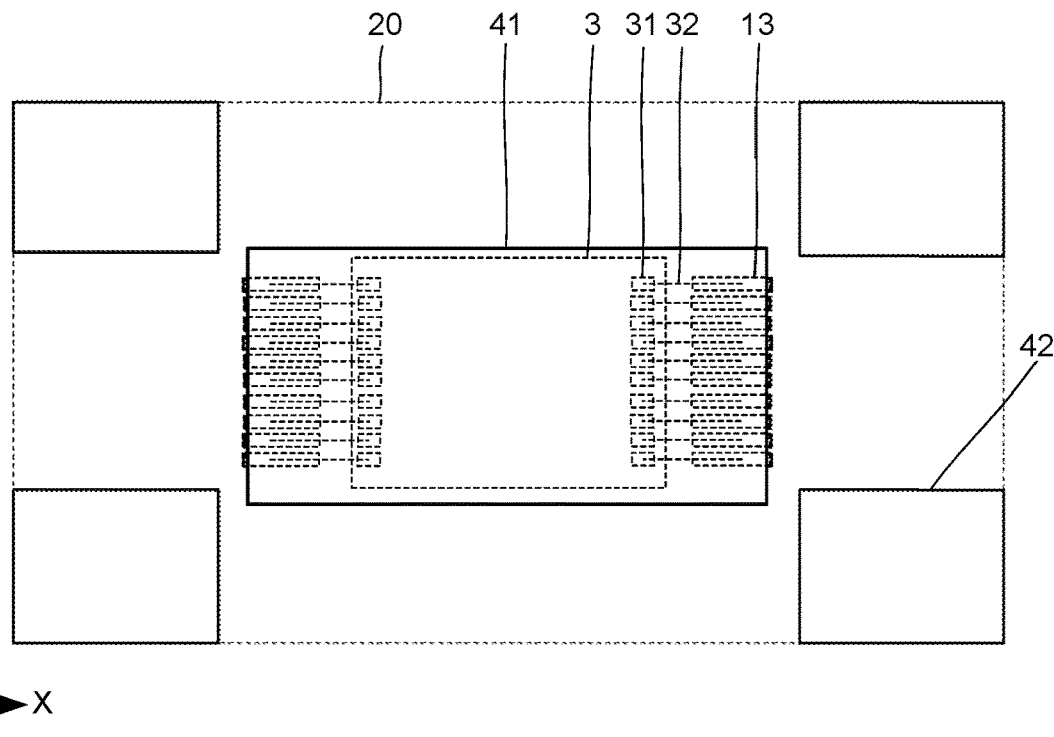
FIG. 17 is a schematic plan view including a part of the semiconductor device.

FIG. 17 is a schematic plan view including a part oldie semiconductor device 100 in the fourth structure example, and illustrates the X-Y plane. FIG. 17 illustrates the semiconductor chip 3, the adhesive layer 41, and the adhesive layer 42.

The adhesive layer 41 is provided between the lowermost semiconductor chip 20 and the semiconductor chip. The adhesive layer 41 is provided on the top surface of the semiconductor chip 3 and covers the semiconductor chip 3 and the bonding wires 32. The adhesive layer 41 covering the semiconductor chip 3 prevents the deformation such as the bending or the tilting of the bonding wire 32 due to the inflow of the sealing resin when the sealing resin flows in between the wiring board 1 and the lowermost semiconductor chip 20 to form the resin area 52 in the sealing process, for example. Consequently, the semiconductor device achieves high reliability.

The fourth structure example of the semiconductor device can be appropriately combined with another structure example of the semiconductor device.

(Fifth Structure Example of Semiconductor Device)

Figure 18:
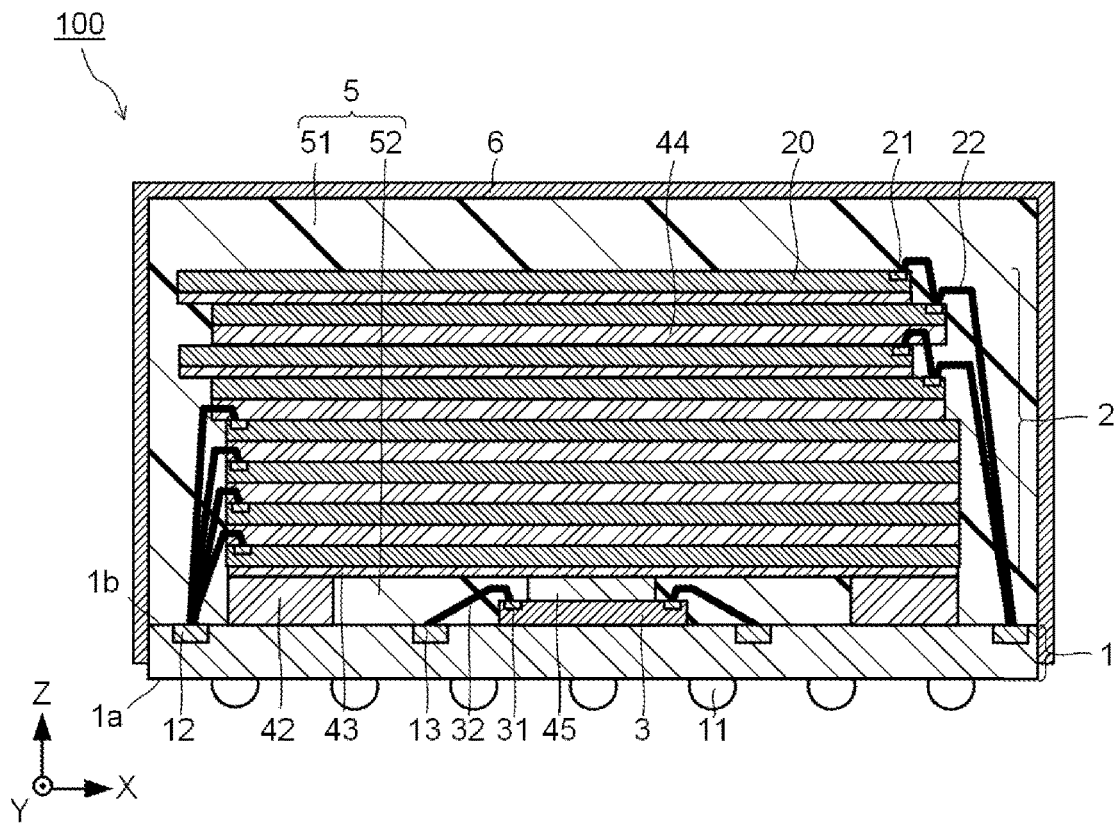
FIG. 18 is a schematic sectional view for explaining a fifth structure example of the semiconductor device.

FIG. 18 is a schematic sectional view for explaining a fifth structure example of the semiconductor device, and illustrates the X-Z cross section.

The semiconductor device 100 illustrated in FIG. 18 includes the wiring board 1, the chip stack 2, the bonding wire 22, the semiconductor chip 3, the bonding wire 32, the adhesive layer 42, the adhesive layer 43, the adhesive layer 44, the adhesive layer 45, the sealing insulation layer 5, and the conductive shield layer 6. Since the wiring board 1, the chip stack 2, the bonding wire 22 the semiconductor chip 3, the bonding wire 32, the adhesive layer 42, the adhesive layer 43, the adhesive layer 44, and the conductive shield layer 6 are the same as those in the first structure example of the semiconductor device, a description thereof can be omitted here to be appropriately quoted from the description of the first structure example.

Figure 19:
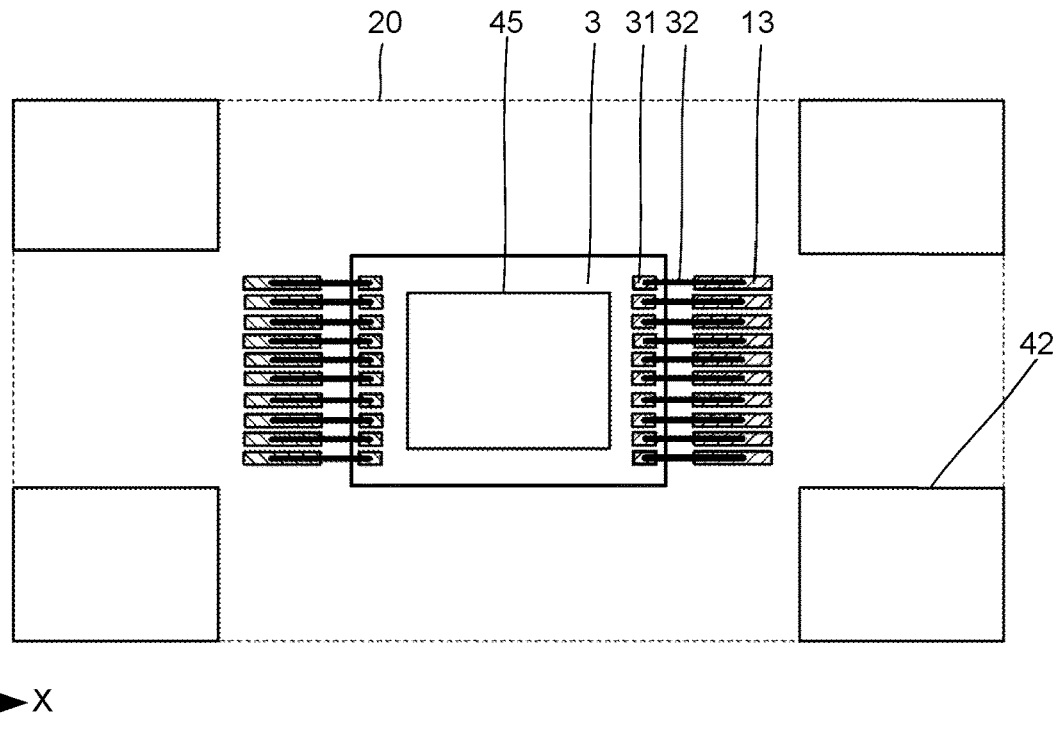
FIG. 19 is a schematic plan view including a part of the semiconductor device.

FIG. 19 is a schematic plan view including a part of the semiconductor device 100 in the fifth structure example, and illustrates the X-Y plane. FIG. 19 illustrates the semiconductor chip 3, the adhesive layer 42, and the adhesive layer 45.

The adhesive layer 45 is provided in place of the adhesive layer 41. The adhesive layer 45 is provided between the lowermost semiconductor chip 20 and the semiconductor chip 3. The adhesive layer 45 is provided on the top surface of the semiconductor chip 3. The adhesive layer 45 illustrated in FIG. 19 does not cover the semiconductor chip 3, but may cover the semiconductor chip 3 without being limited to this.

The adhesive layer 45 preferably contains a different material from a material of the adhesive layer 42. The adhesive layer 45 is preferably smaller in thermal expansion coefficient than the adhesive layer 42. Further, the adhesive layer 45 is preferably made of a material more excellent in properties such as a heat dissipation property, an embedding property of the bonding wire 32, highly accelerated stress test resistance (HAST resistance), and mounting reliability than the adhesive film 42, for example. Examples of the adhesive layer 45 include at least one selected from the group consisting of resin materials such as a urethane resin, an epoxy resin, and a silicon resin. Further, the adhesive layer 45 may be made of the die attach film whose thermal expansion coefficient is smaller than that of the adhesive layer 42. Further, a weight ratio or a volume ratio of a filler (inorganic particles such as $SiO_2$, or the like) contained in the adhesive layer 45 may be higher than a weight ratio or a volume ratio of a filler contained in the adhesive layer 42. In this case, the adhesive layer 45 has a smaller thermal expansion coefficient than that of the adhesive layer 42.

The presence of the adhesive layer 45 prevents the defect such as the displacement of the semiconductor chip 3 due to the inflow of the sealing resin when the sealing resin flows in between the wiring board 1 and the lowermost semiconductor chip 20 to form the resin area 52 in the sealing; process, for example: Consequently, the semiconductor device achieves high reliability.

The fifth structure example of the semiconductor device can be appropriately combined with another structure example of the semiconductor device.

(Sixth Structure Example of Semiconductor Device)

Figure 20:
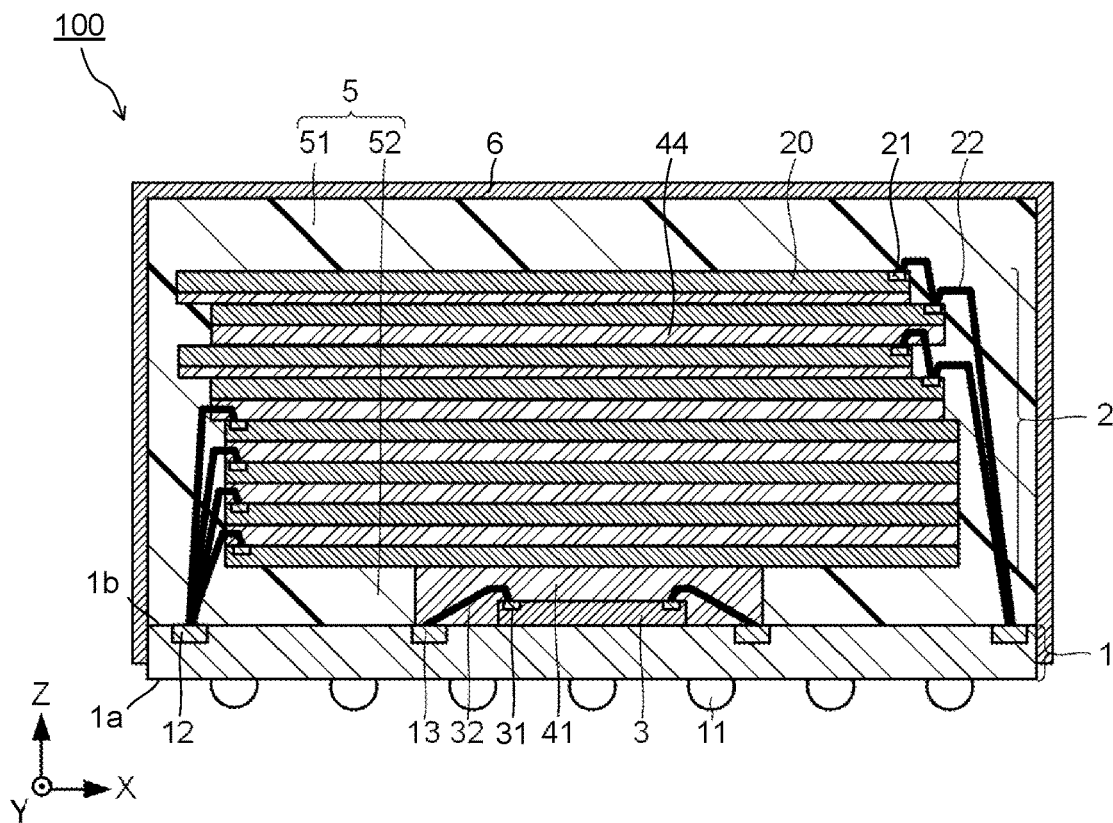
FIG. 20 is a schematic sectional view for explaining a sixth structure example of the semiconductor device.

FIG. 20 is a schematic sectional view for explaining a sixth structure example of the semiconductor device, and illustrates the X-Z cross section.

The semiconductor device 100 illustrated in FIG. 20 includes the wiring board 1, the chip stack 2, the bonding wire 22, the semiconductor chip 3, the bonding wire 32, the adhesive layer 41, the adhesive layer 44, the sealing insulation layer and the conductive shield layer 6. Since the wiring board 1, the chip stack 2, the bonding wire 22, the semiconductor chip 3, the bonding wire 32, the adhesive layer 41, the adhesive layer 44, and the conductive shield layer 6 are the same as those in the fourth structure example of the semiconductor device, a description thereof can be omitted here to be appropriately quoted from the description of the fourth structure example.

Figure 21:
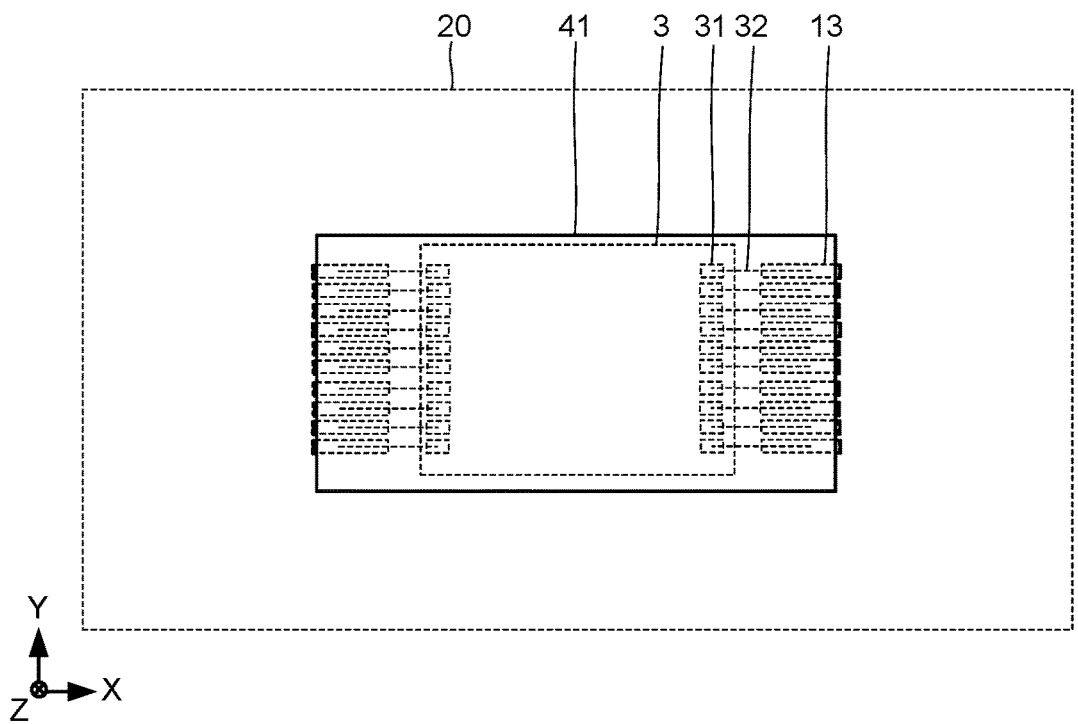
FIG. 21 is a schematic plan view including a part of the semiconductor device.

FIG. 21 is a schematic plan view including a part of the semiconductor device 100, and illustrates the X-Y plane. FIG. 21 illustrates the semiconductor chip 3 and the adhesive layer 41.

The sixth structure example of the semiconductor device does not have adhesive layer 42 and the adhesive layer 43. The omission of the adhesive layer 42 and the adhesive layer 43 enables the semiconductor device to have high reliability and to save costs for manufacturing the semiconductor device, for example.

The sixth structure example of the semiconductor device can be appropriately combined with another structure example of the semiconductor device.

In the second to sixth structure examples, the adhesive layers 41 to 43 can be formed by the above-described first method or second method.

In the fifth structure, example, the adhesive layer 45 can be formed by forming a layer of a material applicable to the adhesive layer 45 on the adhesive layer 43 or on the semiconductor chip 20 after forming the adhesive layer 42 through the above-described first method or second method.

While certain embodiments of the present invention have been described above, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and then equivalents are intended to cover such forms or modifications as would fall within the scope and spirit of the inventions.

What is claimed is:

1. A semiconductor device comprising:
   a wiring board;
   a chip stack provided above the wiring board and including a first semiconductor chip;
   a second semiconductor chip provided between the wiring board and the first semiconductor chip;
   a first adhesive layer provided between the first semiconductor chip and the second semiconductor chip and on the second semiconductor chip; and
   a sealing insulation layer including a first part and a second part, the first part covering the chip stack, and the second part extending between the wiring board and the first semiconductor chip.

2. The device according to claim 1, wherein the first adhesive layer covers the second semiconductor chip.

3. The device according to claim 2, further comprising a bonding wire connecting the wiring board and the second semiconductor chip,
   wherein the first adhesive layer covers the bonding wire.

4. The device according to claim 1, further comprising
a second adhesive layer provided between the first semiconductor chip and the wiring board and spaced from the first adhesive layer,
wherein the second part extends between the first adhesive layer and the second adhesive layer.

5. The device according to claim 4, wherein the second adhesive layer overlaps with an end portion of a surface of the first semiconductor chip.

6. The device according to claim 1, wherein the first adhesive layer is different in thermal expansion coefficient from the sealing insulation layer.

7. The device according to claim 1, wherein the first adhesive layer includes a die attach film.

8. The device according to claim 1, wherein the first adhesive layer contains a different material from a material of a second adhesive layer.

9. The device according to claim 8, wherein the second adhesive layer includes a die attach film.

10. The device according to claim 1, further comprising
a third adhesive layer provided between the first semiconductor chip and the first adhesive layer.

11. The device according to claim 10, wherein the third adhesive layer includes a die attach film.

12. The device according to claim 1, wherein the sealing insulation layer contains silicon oxide.

13. The device according to claim 1,
wherein the first semiconductor chip is a memory chip, and
wherein the second semiconductor chip is a memory controller chip.

* * * * *